(12) United States Patent
Nam et al.

(10) Patent No.: US 7,867,911 B2
(45) Date of Patent: Jan. 11, 2011

(54) METHOD FOR FORMING PATTERN USING HARD MASK

(75) Inventors: Ki-Won Nam, Kyoungki-do (KR); Ky-Hyun Han, Kyoungki-do (KR)

(73) Assignee: Hynix Semiconductor Inc. (KR)

( * ) Notice: Subject to any disclaimer, the term of this patent is extended or adjusted under 35 U.S.C. 154(b) by 803 days.

(21) Appl. No.: 11/823,770

(22) Filed: Jun. 28, 2007

(65) Prior Publication Data
US 2008/0160778 A1    Jul. 3, 2008

(30) Foreign Application Priority Data
Dec. 27, 2006    (KR) ...................... 10-2006-0134340

(51) Int. Cl.
*H01L 21/467*    (2006.01)

(52) U.S. Cl. ...................... 438/710; 438/612; 438/652; 438/585; 257/E21.035; 257/E21.314

(58) Field of Classification Search ................. 438/710, 438/612, 652, 585; 257/E21.035, E21.314
See application file for complete search history.

(56) References Cited

U.S. PATENT DOCUMENTS

| 6,593,233 B1 * | 7/2003 | Miyazaki et al. ............ 438/652 |
| 7,084,071 B1 * | 8/2006 | Dakshina-Murthy et al. ..... 438/717 |
| 2004/0023475 A1 * | 2/2004 | Bonser et al. ............... 438/585 |
| 2006/0231524 A1 * | 10/2006 | Liu et al. ...................... 216/41 |
| 2006/0240188 A1 * | 10/2006 | Fuss et al. ................ 427/248.1 |

FOREIGN PATENT DOCUMENTS

| KR | 2003-0096765 | 12/2003 |
| KR | 10-2004-0057434 | 7/2004 |
| KR | 10-2004-0057502 | 7/2004 |
| KR | 10-2005-0019905 | 3/2005 |
| KR | 10-2006-0010932 | 2/2006 |

* cited by examiner

*Primary Examiner*—Duy-Vu N. Deo
*Assistant Examiner*—Mahmoud Dahimene
(74) *Attorney, Agent, or Firm*—Blakely, Sokoloff, Taylor & Zafman

(57) ABSTRACT

A method for forming a pattern in a semiconductor device includes forming an etch target layer, forming a hard mask over the etch target layer, the hard mask including a multiple-layer stack structure comprising a bottom layer, a transformed layer, and an upper layer, wherein the transformed layer is formed by transforming a surface of the bottom layer. The hard mask and the etch target layer are etched.

9 Claims, 8 Drawing Sheets

METHOD FOR FORMING PATTERN USING HARD MASK

CROSS-REFERENCE TO RELATED APPLICATIONS

The present invention claims priority of Korean patent application number 10-2006-0134340, filed on Dec. 27, 2006, which is incorporated by reference in its entirety.

BACKGROUND OF THE INVENTION

The present invention relates to a method for fabricating a semiconductor device, and more particularly, to a method for fabricating a hard mask and a method for forming a pattern using the hard mask.

As semiconductor devices have shrunken, line patterns such as gate lines and bit lines include a multiple-layer hard mask structure due to a lack of photoresist margin during etching and a lack of self-aligned contact margin during trench-defining.

FIG. 1 illustrates a cross-sectional view of a typical method for forming a pattern. An etch target layer 11 is formed, and a hard mask 12 including multiple layers is then formed. At this time, the hard mask 12 includes a stack structure configured at least with a bottom layer 12A and an upper layer 12B. The bottom layer 12A and the upper layer 12B include different materials.

A bottom anti-reflective coating (BARC) layer 13 is formed over the hard mask 12 to reduce scattering reflection during a photo-exposure process. A photoresist pattern 14 is then formed. Although not shown, the BARC layer 13 is etched using the photoresist pattern 14 as an etch barrier. The hard mask 12 and the etch target layer 11 are also etched to form a pattern.

However, the multiple-layer hard mask 12 may generate undesirable events in some patterns after the patterns are formed due to discordance between the bottom layer 12A and the upper layer 12B. In particular, a large amount of foreign substances may be generated when the hard mask 12 includes a tungsten layer and an amorphous carbon layer and the tungsten layer and the amorphous carbon layer are in direct contact with each other.

FIG. 2 illustrates a micrographic view of foreign substances generated after a pattern is formed. The foreign substances are generated by an abnormal non-uniform contact between a tungsten (W) layer and an amorphous carbon layer in a multiple-layer hard mask during an etch process. The foreign substances are formed on a surface of the tungsten layer.

The foreign substances are often not generated when one of the tungsten layer and the amorphous carbon layer is omitted. However, the hard mask including the tungsten layer and the amorphous carbon layer is used to increase a self-aligned contact margin when forming the pattern and when performing the self-aligned contact etch process for forming contact holes. Thus, it is generally difficult to omit one of the layers.

SUMMARY OF THE INVENTION

Embodiments of the present invention are directed to a method for forming a pattern using a hard mask having multiple layers, which can reduce generation of foreign substances and increase a self-aligned contact margin at the same time.

In accordance with an aspect of the present invention, there is provided a method for forming a pattern in a semiconductor device, including: forming an etch target layer; forming a hard mask over the etch target layer, the hard mask including a multiple-layer stack structure comprising a bottom layer, a transformed layer, and an upper layer, wherein the transformed layer is formed by transforming a surface of the bottom layer; etching the hard mask; and etching the etch target layer.

In accordance with another aspect of the present invention, there is provided a method for forming a pattern in a semiconductor device, including: forming an etch target layer; forming a hard mask over the etch target layer, the hard mask including a multiple-layer stack structure comprising a bottom layer including a tungsten layer, a transformed layer, and an upper layer including an amorphous carbon layer, wherein the transformed layer is formed by transforming a surface of the bottom layer; etching the hard mask; and etching the etch target layer.

DESCRIPTION OF SPECIFIC EMBODIMENTS

Embodiments of the present invention relate to a method for forming a pattern using a hard mask. According to embodiments of the present invention, irregularity between a tungsten layer and an amorphous carbon layer may be removed when using a hard mask that has multiple layers including the tungsten layer and the amorphous carbon layer, by forming a transformed layer having a certain thickness, between the tungsten layer and the amorphous layer, through a surface treatment. Thus, generation of foreign substances may be decreased, and a stable pattern may be formed through uniform etching when forming a pattern using the multiple-layer hard mask.

Figure 1:
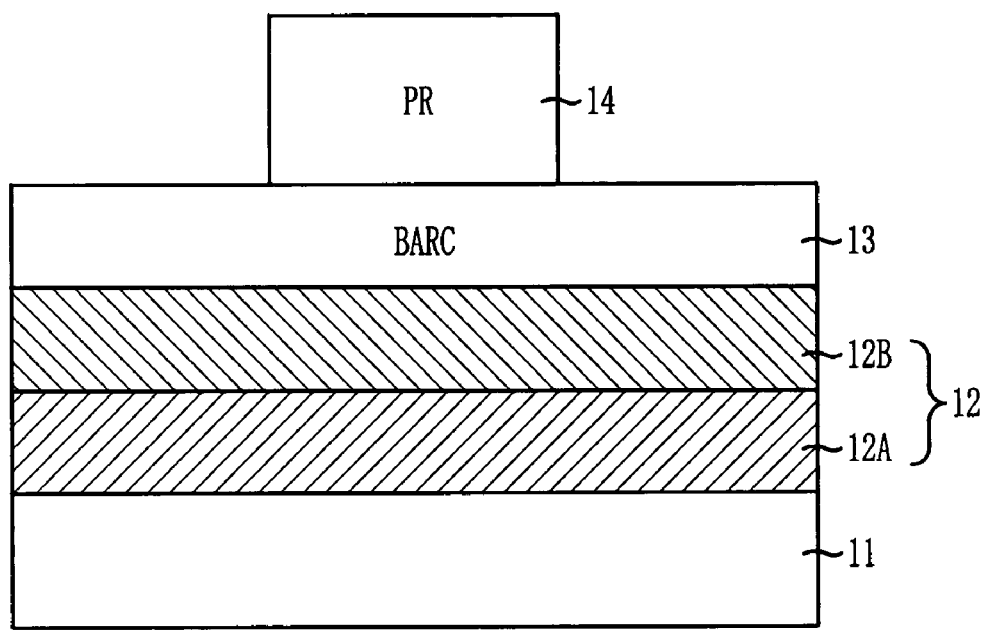
FIG. 1 illustrates a cross-sectional view of a typical method for forming a pattern.
Figure 2:
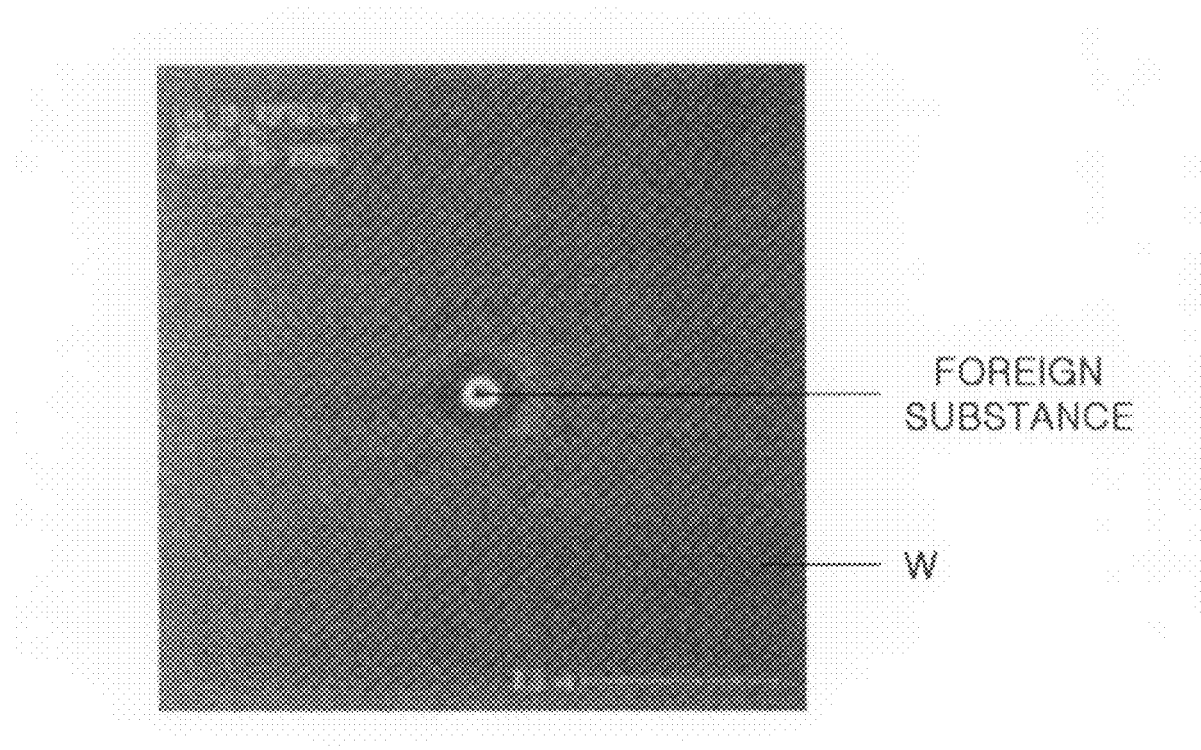
FIG. 2 illustrates a micrographic view of foreign substances generated after a pattern is formed.
Figure 3A:
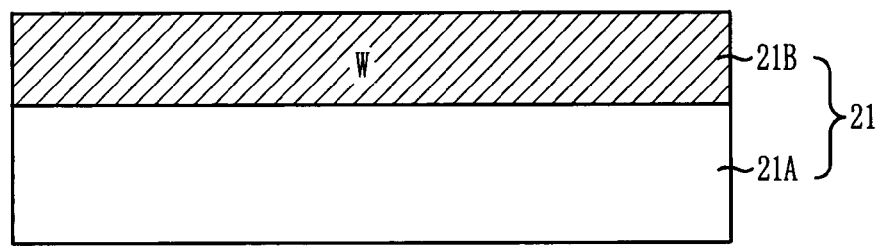
FIGS. 3A to 3C illustrate cross-sectional views of a method for fabricating a hard mask in accordance with an embodiment of the present invention.
Figure 3B:
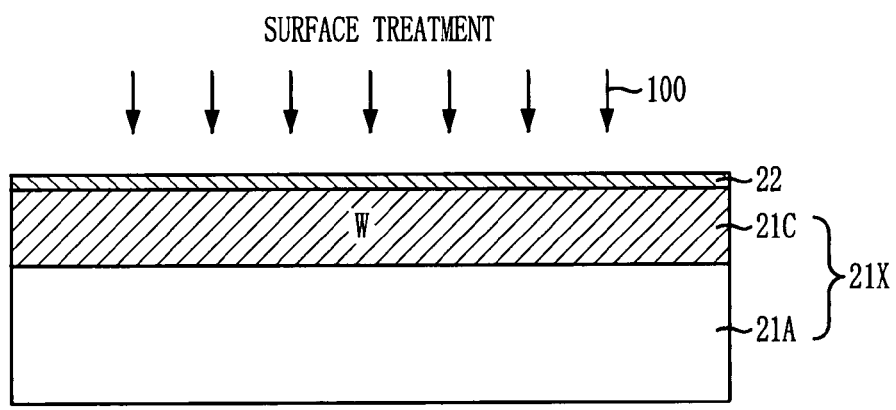
Figure 3C:
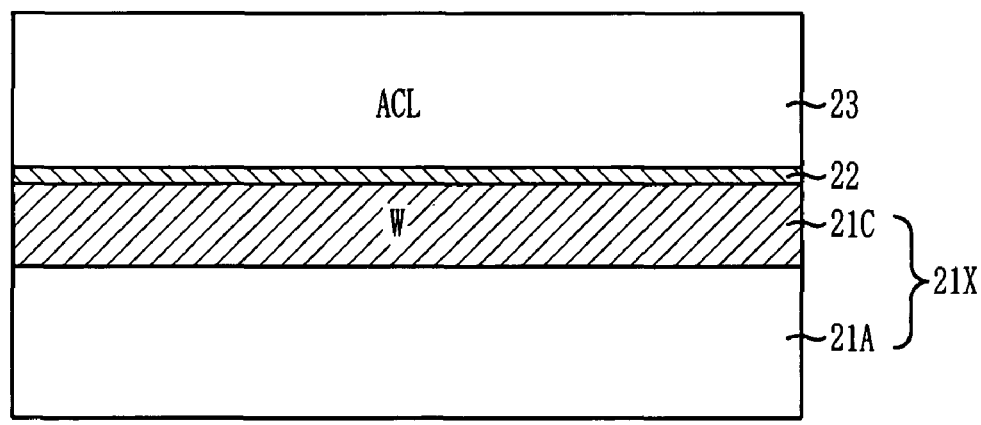

FIGS. 3A to 3C illustrate cross-sectional views of a method for fabricating a hard mask in accordance with an embodiment of the present invention.

Referring to FIG. 3A, a bottom layer 21 is formed. The bottom layer 21 functions as a bottom hard mask and includes a stack structure configured with a nitride-based layer 21A and a tungsten (W) layer 21B.

Referring to FIG. 3B, a surface treatment 100 is performed to form a transformed layer 22 having a certain depth on a surface of a remaining bottom layer 21X. The transformed layer 22 is a portion of the tungsten layer 21B (FIG. 3A) transformed by the surface treatment 100. Reference numeral 21C represents a remaining tungsten layer 21C.

Referring to FIG. 3C, an upper layer 23 is formed over the transformed layer 22. The upper layer 23 functions as an upper hard mask. The upper layer 23 may include an amorphous carbon layer (ACL) or a stack structure configured with an ACL and silicon oxynitride (SiON).

Details of a method for forming the transformed layer 22 shown in FIG. 3B are as follows. The surface treatment 100 may include performing an ion implantation method using a gas including impurities such as arsenic (As), phosphorus (P), or boron (B), or it may include performing a plasma doping (PLAD) method for impinging ionized particles on the surface using glow discharge or plasma power. For instance, the gas including impurities for performing the surface treatment 100 may include one selected from the group consisting of phosphine ($PH_3$) gas, arsine ($AsH_3$) gas, diborane ($B_2H_6$) gas, and trifluoroborane ($BF_3$) gas. The surface treatment 100 uses energy of approximately 3 KeV or greater and a dose of approximately $10^{16}$ atoms/cm$^2$ or greater. Meanwhile, Ar gas may be used as an additive gas when performing the PLAD method.

Thus, the transformed layer 22 including accumulated As, P, or B is formed on the surface of the remaining tungsten layer 21C through the surface treatment 100. That is, the transformed layer 22 becomes a tungsten layer including impurities. For instance, the transformed layer 22 becomes an As-containing tungsten layer, a P-containing tungsten layer, or a B-containing tungsten layer.

Figure 4A:
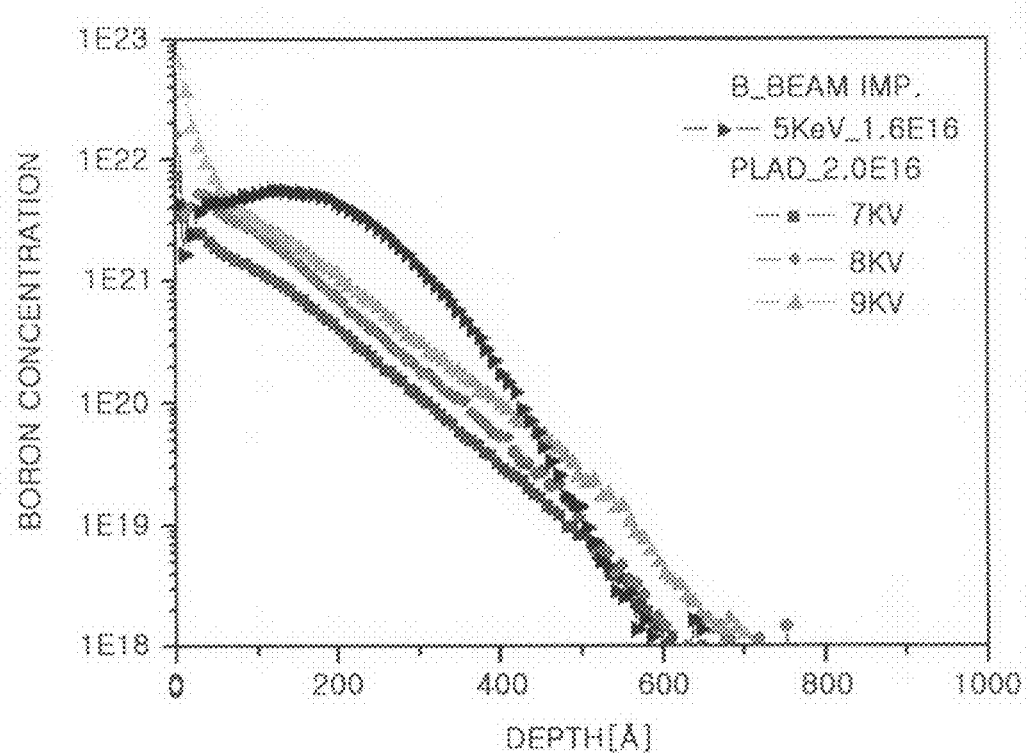
FIG. 4A illustrates a graph comparing levels of transformation according to different surface thicknesses of a transformed layer caused by a surface treatment.

FIG. 4A illustrates a graph comparing levels of transformation according to different surface thicknesses of a transformed layer caused by a surface treatment. Results shown in FIG. 4A are derived by implanting boron (B) using an ion implantation process or a plasma doping method. The implantation of B using the ion implantation process is performed using ion implantation energy of approximately 5 KeV and a dose of approximately $1.6 \times 10^{16}$ atoms/cm$^2$. The implantation of B using the plasma doping method is performed using a dose of approximately $2 \times 10^{16}$ atoms/cm$^2$. Also, ion implantation energy is split into 7 KeV, 8 KeV, and 9 KeV in the implantation of B using the plasma doping method. For instance, the transformed layer 22 may be formed by transforming approximately 200 Å to approximately 400 Å of the tungsten layer 21B (FIG. 3A) form the surface.

The graph shows relationships between depths of the transformed layer 22 in the tungsten layer 21B and boron concentration distributions in the transformed layer 22. A property of a certain portion of the tungsten layer 21B is transformed from the surface to a desired depth. A stacking event in which the transformed layer 22 is stacked over the remaining tungsten layer 21C (FIG. 3B) is generated through a property transformation of the certain portion. The type of the transformed layer 22 depends on the type of the used ions.

Figure 4B:
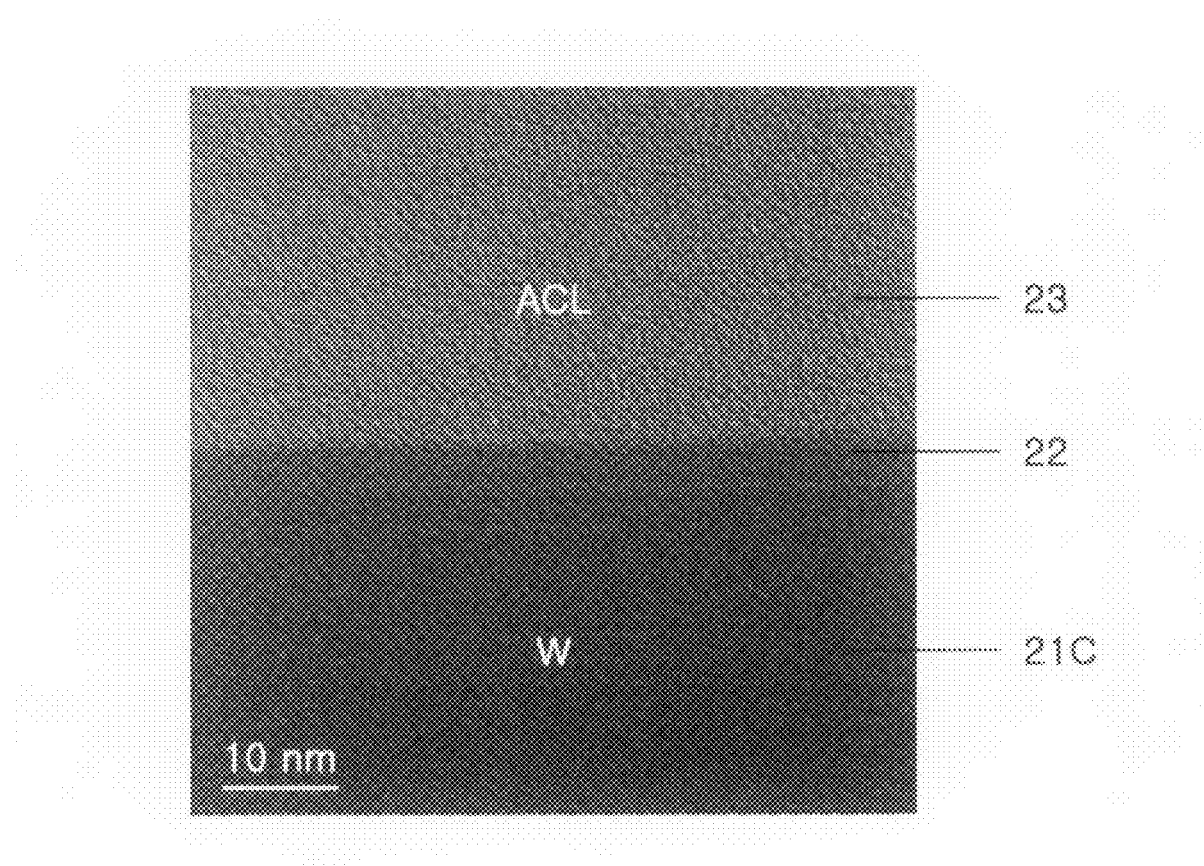
FIG. 4B illustrates a micrographic view showing a transformed layer formed on a surface of a tungsten layer.

FIG. 4B illustrates a micrographic view showing a transformed layer formed on a surface of a tungsten layer. The transformed layer 22 is stacked over the remaining tungsten layer 21C. The upper layer 23 including an ACL is formed over the transformed layer 22.

A direct contact between the remaining tungsten layer 21C and the upper layer 23, especially between the ACL and the remaining tungsten layer 21C, is prevented by the transformed layer 22 formed through the surface treatment 100. Thus, generation of foreign substances is decreased, which may occur by an abnormal combination between the aforementioned layers. The transformed layer 22 functions as a buffer between the remainder of the bottom layer 21X (FIG. 3C) and the upper layer 23.

Consequently, a hard mask according to this embodiment of the present invention includes a multiple-layer stack structure configured with the remaining bottom layer 21X, the transformed layer 22, and the upper layer 23. For instance, the multiple-layer stack structure may include the nitride-based layer 21A, the remaining tungsten layer 21C, the transformed layer 22, and the upper layer 23 including the ACL. Also, the multiple-layer stack structure may include the nitride-based layer 21A, the remaining tungsten layer 21C, the transformed layer 22, and the upper layer 23 including the ACL and SiON. Such hard mask including the multiple-layer stack structure may sufficiently increase a self-aligned contact margin during a self-aligned contact etch process for forming trenches.

Figure 5A:
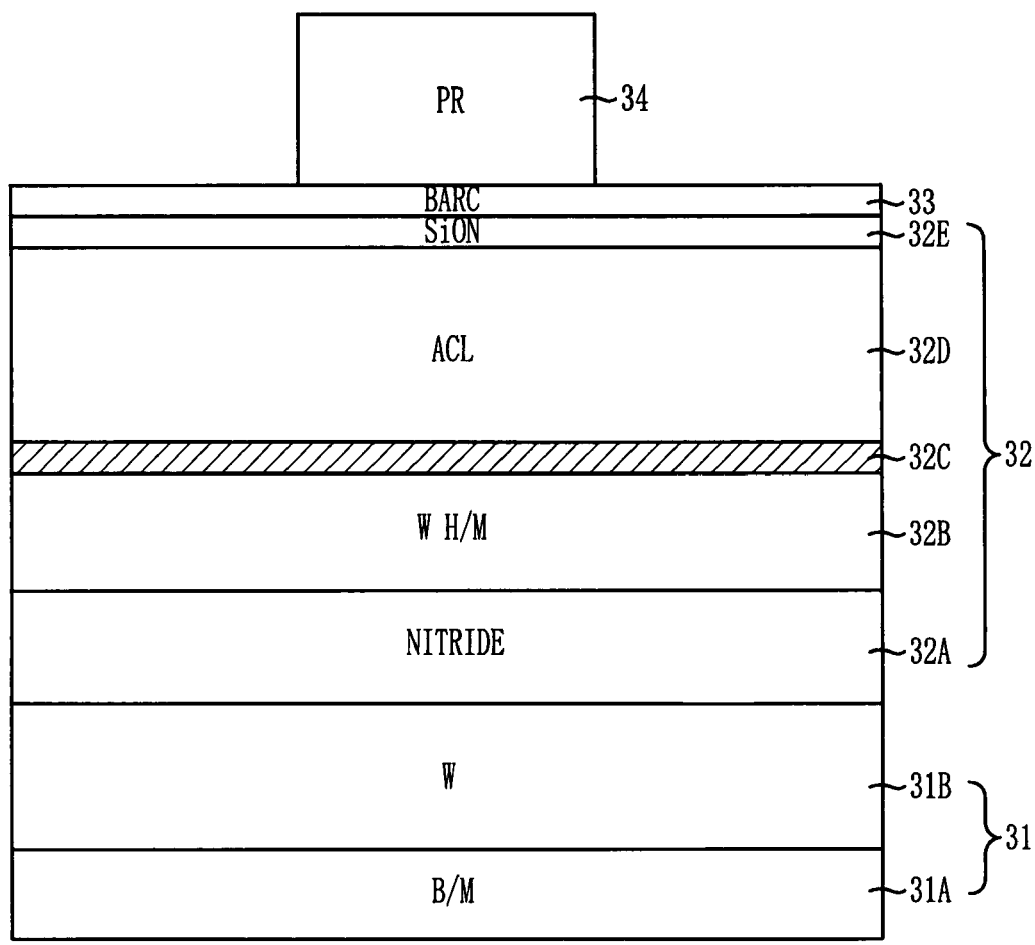
FIGS. 5A to 5C illustrate cross-sectional views of a method for forming a pattern using a hard mask in accordance with an embodiment of the present invention.
Figure 5B:
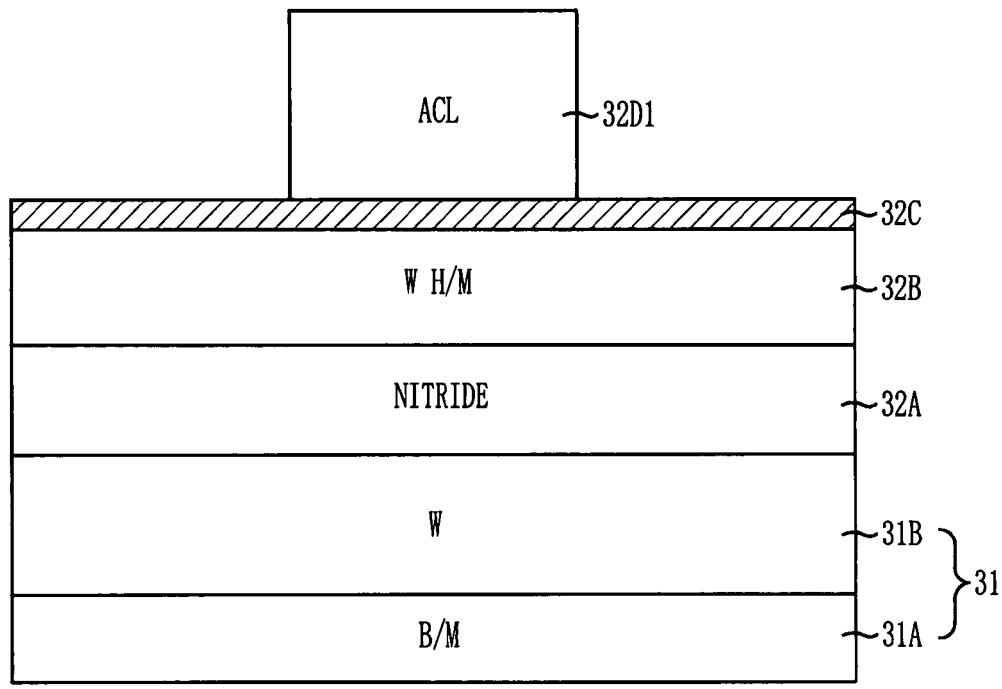
Figure 5C:
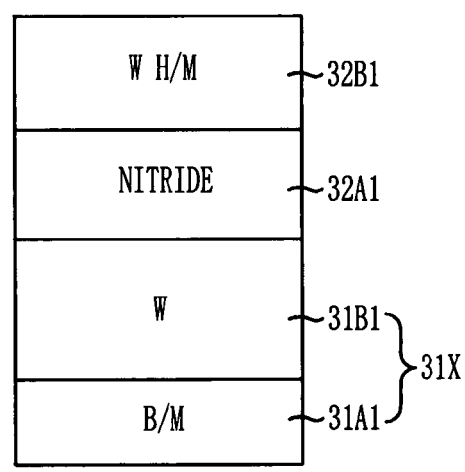

FIGS. 5A to 5C illustrate cross-sectional views of a method for forming a pattern using a hard mask in accordance with an embodiment of the present invention.

Referring to FIG. 5A, an etch target layer 31 is formed. The etch target layer 31 will be patterned using a multiple-layer hard mask as an etch barrier. The etch target layer 31 includes a stack structure configured with a barrier metal (B/M) 31A and a tungsten (W) layer 31B. The barrier metal 31A may include a stack structure configured with titanium (Ti) and titanium nitride (TiN).

A multiple-layer hard mask 32 is formed over the etch target layer 31. At this time, a method for fabricating the multiple-layer hard mask 32 may be referred to as the method shown in FIGS. 3A to 3C.

The multiple-layer hard mask 32 includes a stack structure configured with a nitride-based layer 32A, a tungsten hard mask (W H/M) layer 32B, a transformed layer 32C, an amorphous carbon layer (ACL) 32D, and a silicon oxynitride (SiON) layer 32E. The transformed layer 32C is formed by performing a surface treatment on the tungsten hard mask layer 32B to transform a portion of the tungsten hard mask layer 32B.

The surface treatment may include performing an ion implantation method using a gas including impurities such as Ar, P, or B, or it may include performing a plasma doping (PLAD) method for impinging ionized particles on the surface using glow discharge or plasma power. For instance, the gas including impurities for performing the surface treatment may include one selected from the group consisting of $PH_3$ gas, $AsH_3$ gas, $B_2H_6$ gas, and $BF_3$ gas. The surface treatment uses energy of approximately 3 KeV or greater and a dose of approximately $10^{16}$ atoms/cm$^2$ or greater. Meanwhile, Ar gas may be used as an additive gas when performing the PLAD method. Thus, the transformed layer 32C including accumulated As, P, or B is formed on the surface of the tungsten hard mask layer 32B through the surface treatment.

A direct contact between the tungsten hard mask layer 32B and the ACL 32D is prevented by the transformed layer 32C formed through the surface treatment. Thus, generation of foreign substances is decreased, which may occur by an abnormal combination between the aforementioned layers. The hard mask 32 includes a multiple-layer stack structure configured with the nitride-based layer 32A, the tungsten hard mask layer 32B, the transformed layer 32C, the ACL 32D, and the SiON layer 32E. Thus, a self-aligned contact margin may be sufficiently maintained during a self-aligned contact etch process.

A bottom anti-reflective coating (BARC) layer 33 is formed over the multiple-layer hard mask 32 to reduce scattering reflection during a subsequent photo-exposure process. A photoresist layer is then formed. A photo-exposure and developing process is performed on the photoresist layer to form a photoresist pattern 34.

Referring to FIG. 5B, The BARC layer 33 (FIG. 5A) is etched using the photoresist pattern 34 (FIG. 5A) as an etch barrier. The SiON layer 32E (FIG. 5A) and the ACL 32D (FIG. 5A) are also etched. Reference numeral 32D1 refers to a remaining ACL 32D1. The photoresist pattern 34 is then removed. The remaining BARC layer 33 and the SiON layer 32E are also removed.

Referring to FIG. 5C, the transformed layer 32C (FIG. 5B), the tungsten hard mask layer 32B (FIG. 5B), the nitride-based layer 32A (FIG. 5B), the tungsten layer 31B (FIG. 5B), and the barrier metal 31A (FIG. 5B) are etched to form a pattern, e.g., a bit line pattern, using the remaining ACL 32D1 (FIG. 5B) as an etch barrier. The multiple-layer hard mask 32 (FIG. 5A) remaining after the barrier metal 31A is etched includes a remaining tungsten hard mask layer 32B1 and a remaining nitride-based layer 32A1. The remaining ACL 32D1 and the transformed layer 32C may be removed by the time the pattern is formed and may not remain. Reference numerals 31A1, 31B1, and 31X represent a remaining barrier metal 31A1, a remaining tungsten layer 31B1, and a remaining etch target layer 31X, respectively. The remaining tungsten layer 32B1 is used as a hard mask during a subsequent self-aligned contact etch processes for forming contact holes.

According to the embodiments of the present invention, when using the multiple-layer hard mask, the transformed layer may be formed between the tungsten layer and the amorphous carbon layer configuring the hard mask by performing the surface treatment. Thus, the self-aligned contact margin may be increased during the self-aligned contact etch process using the tungsten layer as the hard mask while the source of foreign substance generation is removed, wherein the foreign substance generation is caused by the abnormal combination with the amorphous carbon.

While the present invention has been described with respect to the specific embodiments, it will be apparent to those skilled in the art that various changes and modifications may be made without departing from the spirit and scope of the invention as defined in the following claims.

What is claimed is:

1. A method for a pattern in a semiconductor device, comprising:

forming an etch target layer;

forming a hard mask over the etch target layer, the hard mask including a multiple-layer stack structure comprising a bottom layer including a tungsten layer, a transformed layer, and an upper layer including an amorphous carbon layer, wherein the transformed layer is formed by transforming a surface of the bottom layer;

etching the hard mask; and etching the etch target layer.

2. The method of claim 1, wherein forming the hard mask comprises:

forming, the tungsten layer;

performing a surface treatment to form the transformed layer; and forming the amorphous carbon layer over the transformed layer.

3. The method of claim 2, wherein performing the surface treatment comprises transforming a surface of the tungsten layer into the transformed layer including impurities.

4. The method of claim 3, wherein performing the surface treatment comprises implanting a gas including the impurities using one of an ion implantation method and a plasma doping method.

5. The method of claim 4, wherein the gas including the impurities comprises one selected from a group consisting of phosphine ($PH_3$) gas, arsine ($AsH_3$) gas, diborane ($B_2H_6$) gas, and trifluoroborane ($BF_3$) gas, and further comprises argon (Ar) when using the plasma doping method.

6. The method of claim 5, wherein performing the surface treatment comprises using a dose of approximately $10^{16}$ atoms/cm$^2$ or greater and energy of approximately 3 KeV or greater.

7. The method of claim 3, wherein the transformed layer is formed to a thickness ranging from approximately 200 Å to approximately 400 Å.

8. The method of claim 1, wherein the bottom layer further comprises a nitride-based layer and the upper layer further comprises a silicon oxynitride (SiON) layer in the hard mask.

9. The method of claim 1, wherein the etch target layer comprises a tungsten layer.

* * * * *